United States Patent [19]

Kawakami

[11] 3,896,476

[45] July 22, 1975

[54] SEMICONDUCTOR SWITCHING DEVICE

[75] Inventor: Akira Kawakami, Itami, Japan

[73] Assignee: Mitsubishi Denki Kabushiki Kaisha, Tokyo, Japan

[22] Filed: Apr. 23, 1974

[21] Appl. No.: 463,412

[30] Foreign Application Priority Data

May 2, 1973 Japan ............................... 48-49538
May 16, 1973 Japan ............................... 48-54478

[52] U.S. Cl. ...................... 357/38; 357/20; 357/39; 357/68; 357/86

[51] Int. Cl. ........................................... H01l 11/10

[58] Field of Search .............. 357/38, 39, 20, 86, 68

[56] References Cited

UNITED STATES PATENTS

| | | | |
|---|---|---|---|
| 3,462,620 | 8/1969 | Weinstein | 357/38 |
| 3,566,211 | 2/1971 | Svedberg | 357/38 |
| 3,725,752 | 4/1973 | Garrett | 357/38 |

FOREIGN PATENTS OR APPLICATIONS

| | | | |
|---|---|---|---|
| 1,185,734 | 3/1970 | United Kingdom | 357/38 |

*Primary Examiner*—Andrew A. James
*Assistant Examiner*—Joseph E. Clawson, Jr.
*Attorney, Agent, or Firm*—Wenderoth, Lind & Ponack

[57] ABSTRACT

A PNPN thyristor is disclosed including an auxiliary gate electrode positioned between a cathode electrode and another auxiliary gate electrode, and adapted to be supplied with a current for turning the thyristor off. Also the thyristor may include a diode connected across the first mentioned auxiliary gate electrode and the gate electrode with a polarity such that a forward current flows from the former toward the latter through it.

9 Claims, 7 Drawing Figures

SEMICONDUCTOR SWITCHING DEVICE

BACKGROUND OF THE INVENTION

This invention relates to improvement in semiconductor switching devices and more particularly thyristors.

It has been commonly practiced to manufacture thyristors by alternately and successively diffusing an N and a P type impurity into a silicon wafer to form a four layer structure of alternate conductivity and disposing electrodes in ohmic contact with the diffusion layers thus formed and at their predetermined positions. Upon connecting the thyristor thus manufactured in chopper or inverter circuits, it is required to reduce the turn-off time of the thyristor. To this end, any suitable heavy metal known as a lifetime killer could be used to dope the silicon wafer to decrease the lifetime of carriers moved within the base region involved to reduce the time of accumulation for minority carriers. This decrease in the lifetime of carriers has been attended with an increase in ON-state voltage for the thyristor and also the deterioration of the blocking effect at elevated temperatures.

To avoid these objections, there have been already proposed gate turn-off (GTO) transistors including an auxiliary gate electrode through which carriers accumulated in the second base layer are swept out. When the number of the carriers swept out is increased, minority carriers from the associated auxiliary emitter layer are injected into the second base layer to increase rather the turn-off time of the thyristor, because a PN junction formed between the two layers is forwardly biased.

Further conventional thyristors have been disadvantageous in that a plurality of control terminals are required, the control circuit becomes complicated and expensive, the package structure thereof is complicated and so on.

SUMMARY OF THE INVENTION

Accordingly, it is an object of the present invention to provide a new and improved semiconductor switching device having a reduced turn-off time.

It is another object of the present invention to provide a new and improved semiconductor switching device of the triode type including an electrode structure having a reduced turn-off time, and a single control terminal for selectively supplying to the device a current for turning it on and a current for turning the device off.

According to the principles of the present invention, there is provided a semiconductor switching device comprising, a first emitter layer of a first type conductivity, a first base layer of a second type conductivity disposed on the first emitter layer, a second base layer of the first type conductivity disposed on the first base layer, a second emitter layer of the second type conductivity disposed in a surface adjacent portion of the second base layer, an auxiliary emitter layer of the second type conductivity disposed in a surface adjacent portion of the second base layer and separated from the second emitter layer, an anode electrode disposed in ohmic contact with the frist emitter layer, a cathode electrode disposed in ohmic contact with the second emitter layer, a first auxiliary gate electrode disposed in ohmic contact with both the auxiliary emitter layer and one portion of the second base layer to bridge them, a second auxiliary gate electrode disposed in ohmic contact with the second base layer and interposed between the cathode electrode and the first auxiliary gate electrode, a gate electrode disposed in ohmic contact with the second base layer opposed to the first auxiliary gate electrode, the gate electrode being located on that side of the first auxiliary gate electrode remote from the second auxiliarly gate electrode, and circuit means for applying a gate signal to the gate electrode to turn the device on and for applying to the second auxiliary gate electrode a gate signal opposite in polarity to the first mentioned gate signal to turn the device off.

In order to provide a semiconductor switching device of the triode type, a semiconductor diode may be connected across the second auxiliary gate electrode and the gate electrode and so poled that a forward current flows from the second auxiliary gate electrode toward the gate electrode, therethrough.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figures 1, 2, 3, 3A:
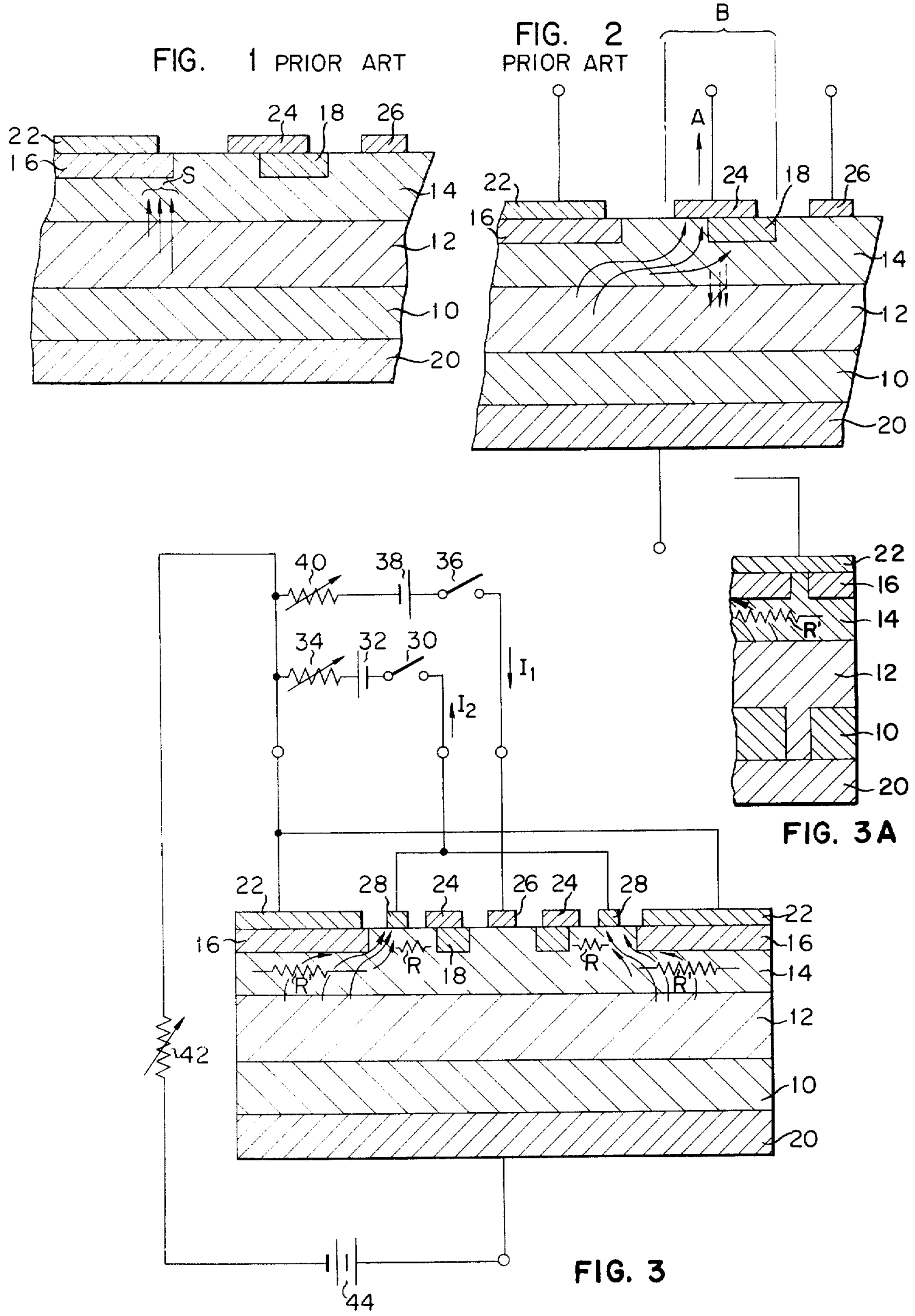
FIG. 1 PRIOR ART, FIG. 2 PRIOR ART, FIG. 3A, FIG. 3
FIGS. 1 and 2 are fragmental sectional views of thyristors with the auxiliary gate constructed in accordance with the principles of the prior art.
FIG. 3 is a sectional view of a thyristor with an auxiliary gate constructed in accordance with the principles of the present invention illustrating also a control circuit therefor.
FIG. 3A is a partial view of a modified thyristor as shown in FIG. 3.

Referring now to the drawings and FIG. 1 in particular, there is shown a conventional thyristor produced by alternately and successively diffusing an N and a P type impurity into a silicon wafer to form four diffusion layers of alternate conductivity. Then electrodes are disposed in ohmic contact with predetermined layers at predetermined positions. More specifically, the arrangement illustrated includes a first emitter layer 10 having an N or a P type impurity diffused into the silicon wafer, a first base layer 12 of N or P type conductivity disposed on the first emitter layer 10. A second base layer 14 of P or N type conductivity disposed on the first base layer 14, a second emitter layer 16 of N or P type conductivity disposed in one portion of the second base layer 14 to be exposed to one of the main opposite faces of the wafer, and an auxiliary emitter layer 18 disposed in another position of the second base layer 14 to be exposed to the one main face of the wafer. The auxiliary emitter layer 18 serves to increase an initial turn-on area S (see FIG. 1) in order to improve the critical rate of rise of an on-state current.

Then an anode electrode 20 is disposed in ohmic contact with the first emitter layer 10 through an aluminum evaporated film (not shown). The anode electrode 20 may be formed of molybdenum. Aluminum is evaporated upon the second cathode layer 16 to form a cathode electrode 22 disposed in ohmic contact therewith. Similarly an auxiliary emitter electrode 24 is disposed in ohmic contact with both the auxiliary emitter layer 18 and one portion of the second base layer 14 to bridge the two and a gate electrode 24 is disposed in ohmic contact with the second base layer 14.

With the thyristor of FIG. 1 connected in chopper or inverter circuits, it is required to reduce the turn-off time thereof. To this end, it has been previously practiced to dope a silicon wafer with an impurity formed of the heavy metal serving as a lifetime killer to reduce the lifetime of carriers being moved through the second base layer thereby to reduce a time of accumulation of minority carriers. According to this measure, this reduction in lifetime of the carriers has been accompanied by an increase in the on-state voltage and also by the deterioration of the blocking effect at elevated temperatures. This has resulted in thyristors with both decreased current capacity and withstanding voltage.

In order to eliminate these objections, it has would be possible to apply a turning-off gate signal A to the auxiliary gate electrode 24 as shown in FIG. 2 wherein like reference numerals designate the components identical to those shown in FIG. 1. The signal A serves to sweep out those carriers accumulated in the second base layer 14. That is, one would have utilized the turn-off function of the so-called gate turn-off (GTO) thyristors. If desired, the signal could be applied to the gate electrode 26 rather than to the auxiliary gate electrode 24.

In the case where the turning-off gate signal is applied to the auxiliary gate electrode or gate electrode, an increase in the number of the accumulated carriers swept out from the auxiliary gate electrode 24 or gate electrode 26 results in the forward biasing of a P-N junction formed between the first and second base layers 12 and 14. This causes the minority carriers from the auxiliary emitter layer 18 to be injected into the second base layer 14 whereby an auxiliary gate region B (see FIG. 2) is apt to meet the requirements for turning on. Therefore the turn-off time of thyristors has been increased which is contrary to the desired purpose.

In FIGS. 1 and 2 a stream of holes is designated by a solid line while a stream of electrons is designated by a dotted line.

From the foregoing it will be appreciated that, in conventional thyristors including the auxiliary gate region B, it can not be expected that the turn-off time thereof can be reduced by a sweep-out of accumulated carriers.

Also, the arrangements such as shown in FIGS. 1 and 2 have been disadvantageous in that a plurality of terminals for control electrodes are required and the associated control circuit becomes complicated and expensive while the package of thyristor elements is complicated in construction causing difficulties with which thyristors can be handled.

The present invention contemplates to eliminate the disadvantages of the prior art practice as above described.

Figure 4:
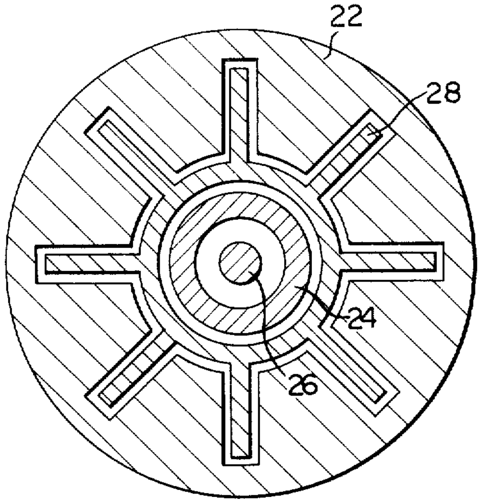
FIG. 4 is a plan view of the thyristor shown in FIG. 3.

Referring now to FIG. 3 wherein like reference numerals designate the components identical or similar to those shown in FIG. 1, there is illustrated a thyristor constructed in accordancd with the principles of the present invention. The arrangement illustrated is of a circular shape as shown in FIG. 4 and includes, in addition to the components as above described in accordance with FIG. 1, a second auxiliary gate electrode 28 disposed in ohmic contact with the second base layer 14 between the auxiliary gate and cathode electrodes 24 and 22, respectively with all the electrodes except for the anode and gate electrodes being in the form of concentric annuli.

Then the second auxiliary gate electrode 28 is connected to the cathode electrode 22 through a normally open switch 30, a source 32 of direct current and a variable resistor 34. The gate electrode 26 in the form of a disc is connected to the cathode electrode 22 through a normally open switch 36, another source 38 of direct current and a variable resistor 40. It is noted that the gate electrode 26 is connected to the positive side of the source 38 while the auxiliary gate electrode 28 is connected to the negative side of the source 32. Also the cathode electrode 22 is connected to the anode electrode 20 in the form of a disc through a variable resistor 42 and a separate source 44 of direct current with the positive side of the source 44 connected to the anode electrode 20. In this way the arrangement forms a tetrode thyristor.

A process of producing the thyristor as shown in FIG. 3 will now be briefly described. A silicon wafer with a give type conductivity, in this case, an N-type conductivity, having a resistivity of 40 ohms-cm is prepared in the shape of a disc having a diameter of 40 mm and a thickness of 350 microns. Then a P-type impurity, for example, gallium (Ga) and an N-type impurity, for example, phosphorous (P) are alternately and successively diffused into the silicon wafer thus prepared to form a PNPN four layer structure. The four layer structure includes a first emitter layer 10 of a first type conductivity in this case, a P-type conductivity, a first base layer 12 of a second type conductivity, in this case, a P-type conductivity, a second base layer 14 of the first type conductivity, a second emitter layer 16 of the second type conductivity, and an auxiliary emitter layer 18 of the second type conductivity as in the arrangement as shown in FIG. 1.

Subsequently gold is evaporated upon the main opposite faces of the silicon wafer and then the wafer is heated to a temperature of 850°C for 20 minutes to diffuse the evaporated gold into the wafer and particularly into at least the first and second base layers 12 and 14. Thereafter an anode electrode 20, a cathode electrode 22, the gate electrode 26, and a first auxiliary gate electrode 24 are disposed in ohmic contact with the associated layers respectively as in the arrangement of FIG. 1. The second auxiliary gate electrode 28 is disposed in ohmic contact with the second base layer 14 between the first auxiliary gate electrode 24 and the cathode electrode 22 as above described. Thus the gate electrode 26 is opposite to the first auxiliary gate electrode 24 and located on that side of the first auxiliary gate electrode 24 remote from the second auxiliary gate electrode 28.

Terminals are connected to the anode, cathode, gate, second auxiliary gate electrodes respectively. Then the arrangement thus formed is housed in an enclosed container while the terminals are extended and sealed in electrically insulating relationship through the container. Then the sources, switches and variable resistors as above described can be connected between the gate and second auxiliary gate terminals and the cathode terminal and between the anode and cathode terminals.

FIG. 4 shows the arrangement of FIG. 3 as viewed from the side of the cathode electrode 22. As seen in FIG. 4, the second auxiliary gate electrode 28 is interposed between the first auxiliary gate and cathode electrodes 24 and 22 respectively and includes a plurality of protrusions radially outwardly directed at substantially equal angular intervals. The protrusions enter radial indentation in the cathode electrode 22 which are complementary in shape to the protrusions with a predetermined spacing therebetween. Therefore the first and second auxiliary gate electrodes 24 and 28 respectively forming parts of the gate electode 26 has therebetween a resistance R (see FIG. 3) the magnitude of which is determined by the shape and width of the interelectrode spacing and the surface resistance of the first base layer 14. Further, as in GTO thyristors, the thyristor of FIG. 3 has a decreased gate turn-off gain due to the lateral resistance of the second base layer 14. To prevent this decrease in the gate turn-off gain, the second auxiliary gate electrode 28 is formed in the configuration as above described to decrease the lateral resistance R' (see FIG. 3).

In the arrangement as shown in FIGS. 3 and 4, after the switch 36 has been kept in its closed position for a predetermined time interval, a current $I_1$ (see FIG. 3) from the source 38 flows through the now closed switch 36 into the gate electrode 26 and thence to the second base layer 14. Then the current $I_1$ flows back to the source 38 through the second emitter layer 16, the cathode electrode 22 and the resistor 40. Thus the thyristor is turned on.

Then to put the thyristor in its reverse blocking state, the switch 30 is turned on for a predetermined time interval. This causes a current $I_2$ (see FIG. 3) from the source 32 to flow through the resistor 34, the cathode electrode 22, the second emitter layer 16, the second base layer 14, the second auxiliary gate, electrode 28, the now closed switch 30 and back to the source 30. The current $I_2$ is opposite in direction of flow to the current $I_1$ and permits the minority carriers existing in a region formed by the first N type base layer and second type base layer 12 and 14 to be partly lost through recombination while they are externally swept out through the second auxiliary gate electrode 28 as shown by the solid arrows in FIG. 3. At that time, the resistance R serves to decrease the number of holes from the second base layer 14 to flow into the auxiliary emitter layer 18 through a P-N junction formed between the second base layer and auxiliary emitter layer 14 and 18 respectively. Under these circumstances, that P-N junction is not forwardly biased and therefore electrons from the auxiliary emitter layer 16 are injected into the second base layer 14 only with difficulty resulting in the thyristor having a reduced turn-off time.

Figure 5:
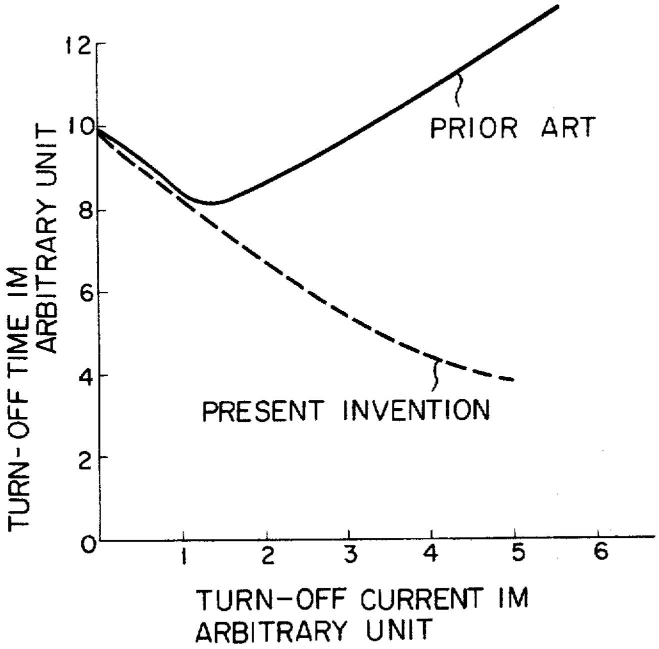
FIG. 5 is a graph illustrating a turn-off time plotted against a turn-off current for each of a conventional thyristor and a thyristor of the present invention.

FIG. 5 is a graph illustrating turn-off time in arbitrary units (ordinate) plotted against turn-off current $I_2$ in arbitrary units (abscissa). As shown by the solid line in FIG. 5, conventional transistors have the turn-off time first reduced with a decrease in the turn-off current $I_2$ and then reaching a minimum value. Thereafter the turn-off time increases as the turn-off current decreases. On the other hand, the transistor as shown in FIGS. 3 and 4 has a turn-off time gradually reduced with a decrease in turn-off current $I_2$, as shown by the dotted line in FIG. 5.

In order to reduce the turn-off time, it is essential that the resistance R ensures that the P-N junction between the auxiliary emitter layer 18 and the second base layer 16 is prevented from being forwardly biased. To this end, the surface portion of the second base layer 14 disposed between the first and second auxiliary gate electrodes 26 and 24 is not restricted to the shape as shown in FIG. 4 and the shape may be varied. Alternatively the second base layer 16 may have a surface impurity concentration which changes.

The present invention as shown in FIGS. 3 and 4 is advantageous in that the P-N junction between the second base layer and auxiliary emitter layers has a decreased forward bias to reduce the turn-off time. This is because a resistance having a predetermined magnitude is interposed between the auxiliary emitter and second base layers by disposing the second auxiliary gate electrode between the first auxiliary gate and cathode electrodes.

Figure 6:
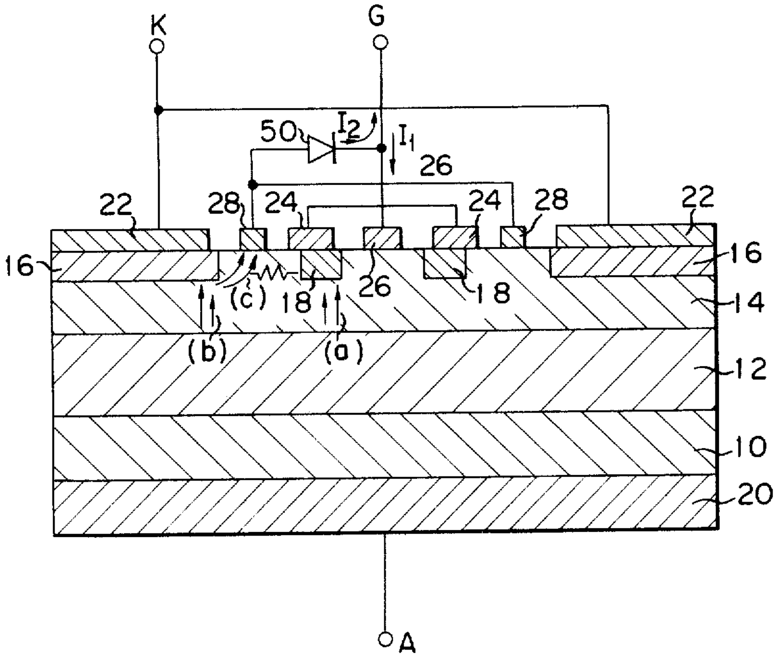
FIG. 6 is a sectional view of a triode thyristor constructed in accordance with the principles of the present invention.

While the present invention has been illustrated and described in conjunction with a tetrode thyristor the same can be realized in a triode thyristor such as shown in FIG. 6, wherein like reference numerals designate the components identical or similar to those illustrated in FIGS. 3 and 4.

The arrangement as shown in FIG. 6 is identical to that illustrated in FIGS. 3 and 4 excepting that a semiconductor diode 50 is connected across the second auxiliary gate electrode 28 and the gate electrode 26 and so poled that a forward current flows from the second auxiliary electrode 28 toward the gate electrode 26. Therefore the terminal connected to the second auxiliary gate electrode 28 along with the switches, sources and variable and resistors as shown in FIG. 3 is omitted resulting in a triode thyristor including an anode, a cathode and a gate terminal A, K and G (see FIG. 6).

In the arrangement of FIG. 6, the gate terminal G is utilized to turn it on and off. More specifically, an energizing current is applied across the gate and cathode electrode G and K respectively so that the gate electrode G is positive with respect to the cathode electrode K. As shown in FIG. 6, that current causes a turn-on current $I_1$ from the gate electrode G to flow through the silicon wafer to turn the latter on to permit the principal current to flow therethrough as shown at the arrows (a) and (b).

On the contrary, an energizing current rendering the cathode electrode K positive with respect to the gate electrode G is applied across both electrodes to permit a turn-off current $I_2$ to flow from the wafer to the diode 50 through the second auxiliary gate electrode 28 as shown at the arrows (c) in FIG. 6. Therefore it is possible to extract accumulated carriers through the second auxiliary gate electrode 28.

From the foregoing it will be apparent that, by connecting the semiconductor diode across the second auxiliary gate electrode and the gate electrode on the thyristor including another auxiliary gate electrode with a polarity such that a forward current flows from the second auxiliary gate electrode toward the gate electrode therethrough, a single control terminal can be utilized to cause currents for turning the thyristor on and off respectively to selectively flow through the latter. Therefore, there is provided a semiconductor switching device of the triode type having a reduced turn-off time and a high critical rate of rise of an on-state current.

While the present invention has been illustrated and described in conjunction with a few preferred embodiments thereof it is to be understood that numerous changes and modifications may be resorted to without departing from the spirit and scope of the present invention. For example, the semiconductor diode 50 may be embedded in the interior of the thyristor element instead of disposing it outside of the element. Also the first auxiliary gate electrode 24 may be divided into an auxiliary emitter electrode disposed in ohmic contact with the auxiliary emitter layer 18 alone and an auxiliary electrode can be disposed in ohmic contact with the second base layer 14 on the side thereof near to the cathode electrode 22. That auxiliary electrode forms the first auxiliary gate electrode. Then both electrodes are electrically interconnected. Further while the present invention has been described in conjunction with a reverse blocking thyristor it is to be understood that it is equally applicable to reverse conducting thyristors wherein the first N-base layer (12) includes one portion electrically connected to the anode electrode 20 and the second P-base layer 14 electrically includes one portion connected to the cathode electrode 22 as shown in FIG. 3A. In addition, the present invention is equally applicable to NPNP thyristors formed in P-type silicon wafers.

What is claimed is:

1. A semiconductor switching device comprising: a first emitter layer of a first type conductivity, a first base layer of a second type conductivity disposed on said first emitter layer, a second base layer of said first type conductivity disposed on said first base layer, a second emitter layer of said second type conductivity disposed in a surface adjacent portion of said second base layer, an auxiliary emitter layer of said second type conductivity disposed in a surface adjacent portion of said second base layer and separated from said second emitter layer, an anode electrode disposed in ohmic contact with said first emitter layer, a cathode electrode disposed in ohmic contact with said second emitter layer, a first auxiliary gate electrode disposed in ohmic contact with the both said auxiliary emitter layer and one portion of said second base layer to bridge them, a second auxiliary gate electrode disposed in ohmic contact with said second base layer and interposed between said cathode electrode and said first auxiliary gate electrode, a gate electrode disposed in ohmic contact with said second base layer opposed to said first auxiliary gate electrode, said gate electrode being located on said second base layer on that side of said first auxiliary gate electrode remote from said second auxiliary gate electrode, and circuit means for applying a gate signal said gate electrode to turn the device on and for applying to said second auxiliary gate electrode a gate signal opposite in polarity to the first-mentioned gate signal to turn the device off.

2. A semiconductor switching device as claimed in claim 1 wherein said first auxiliary gate electrode bridges said auxiliary emitter layer and that portion of said second base layer near to said cathode electrode.

3. A semiconductor switching device as claimed in claim 1 wherein said second auxiliary gate electrode is positioned with respect to said first auxiliary gate electrode at a predetermined spacing so that that portion of the surface of said second base layer disposed between said first and second auxiliary gate electrodes has formed thereon a resistance having a magnitude sufficient to prevent a P-N junction formed between said auxiliary emitter layer and said second base layer from being forwardly biased.

4. A semiconductor switching device as claimed in claim 1 wherein a semiconductor diode is connected across said second auxiliary gate electrode and said gate electrode so that a forward current flows from said second auxiliary gate electrode toward said gate electrode, therethrough.

5. A semiconductor switching device as claimed in claim 1 wherein gold is diffused at least said first base layer and said second base layer.

6. A semiconductor switching device as claimed in claim 1 wherein said gate electrode is located on the central portion of said second base layer, and surrounded by said first auxiliary gate electrode, and said second auxiliary gate electrode surrounds said first auxiliary gate electrode and includes a plurality of protrusions radially outwardly directed and extending into corresponding indentations in said first auxiliary gate electrode with a space therebetween.

7. A semiconductor switching device as claimed in claim 1 wherein said first base layer includes one portion electrically connected to said anode electrode and said second base layer includes one portion electrically connected to said cathode electrode whereby the device forms a reverse conducting thyristor.

8. A semicondutor switching device comprising a first emitter layer of a first type conductivity, a first base layer of a second type conductivity disposed on said first emitter layer, a second base layer of said first type conductivity disposed on said first base layer, a second emitter layer of said second type conductivity disposed in a surface adjacent portion of said second base layer, an auxiliary emitter layer of said second type conductivity disposed in a surface adjacent portion of said second base layer and separated from said second emitter layer, an anode electrode disposed in ohmic contact with said first emitter layer, a cathode electrode disposed in ohmic contact with said second emitter layer, an auxiliary emitter electrode disposed in ohmic contact with said auxiliary emitter layer, a first auxiliary gate electrode disposed in ohmic contact with said second base layer and between said cathode electrode and said auxiliary emitter electrode, said first auxiliary gate electrode being connected to said auxiliary emitter electrode, a second auxiliary gate electrode disposed in ohmic contact with said second base layer and between said cathode electrode and said first auxiliary gate electrode, a gate electrode disposed in ohmic contact with said second base layer and on that side of said auxiliary emitter electrode remote from said first auxiliary gate electrode, and circuit means for applying a gate signal to said gate electrode to turn the device on and for applying to said second auxiliary gate electrode a gate signal opposite in polarity to the firstmentioned gate signal to turn the device off.

9. A semiconductor switching device as claimed in claim 8 wherein a semiconductor diode is connected across said second auxiliary gate electrode and said gate electrode so that a forward current flows from said second auxiliary gate electrode toward said gate electrode therethrough.

* * * * *